United States Patent
Stave et al.

(10) Patent No.: US 12,068,751 B2
(45) Date of Patent: Aug. 20, 2024

(54) SYSTEMS AND TECHNIQUES FOR JITTER REDUCTION

(71) Applicant: Micron Technology, Inc., Boise, ID (US)

(72) Inventors: Eric J. Stave, Meridian, ID (US); Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 17/852,657

(22) Filed: Jun. 29, 2022

(65) Prior Publication Data

US 2024/0007092 A1    Jan. 4, 2024

(51) Int. Cl.
| | |
|---|---|
| G11C 11/4076 | (2006.01) |
| G11C 7/22 | (2006.01) |
| H03K 5/1534 | (2006.01) |
| H03K 5/156 | (2006.01) |
| H03K 19/21 | (2006.01) |

(52) U.S. Cl.
CPC ........... *H03K 5/1565* (2013.01); *G11C 7/222* (2013.01); *H03K 5/1534* (2013.01); *H03K 19/21* (2013.01)

(58) Field of Classification Search
CPC .... G11C 7/222; H03K 5/1565; H03K 5/1534; H03K 19/21
See application file for complete search history.

(56) References Cited

U.S. PATENT DOCUMENTS

| | | | |
|---|---|---|---|
| 2015/0149808 A1* | 5/2015 | Lu | G06F 13/4068 713/501 |
| 2019/0212770 A1* | 7/2019 | Hashempour | H03K 3/017 |
| 2021/0159903 A1* | 5/2021 | Murata | H03L 7/22 |
| 2021/0391865 A1* | 12/2021 | Sokolov | H03L 7/0895 |

* cited by examiner

*Primary Examiner* — Min Huang
(74) *Attorney, Agent, or Firm* — Fletcher Yoder, P.C.

(57) ABSTRACT

A device includes a clock input circuit that when in operation receives a clock signal and transmits an internal clock signal based on the clock signal. The device also includes an internal clock generator coupled to the clock input circuit to receive the internal clock signal, wherein the internal clock generator comprises clock adjustment circuitry that when in operation generates a phase controlled internal clock signal having subsequent clock edges based upon a single clock edge of the internal clock signal, wherein the phase controlled internal clock signal comprises a first frequency as a multiple of a second frequency of the internal clock signal.

19 Claims, 7 Drawing Sheets

SYSTEMS AND TECHNIQUES FOR JITTER REDUCTION

BACKGROUND

Field of the Present Disclosure

Embodiments of the present disclosure relate generally to the field of semiconductor devices. More specifically, embodiments of the present disclosure relate to modifications of internal clocks of an electronic device, for example, a memory device.

Description of Related Art

Semiconductor devices (e.g., memory devices) have increasingly been designed to perform a greater number of operations (e.g., refreshing of memory cells, row hammer refresh operations, error checking and/or correcting operations, and the like). The speed at which these operations are performed are not always the same. For example, some operations utilize clock speeds that are greater than clock speeds utilized in other operations. Additionally, as the size of devices continues to be reduced, there is less physical space for clock generating circuitry on die. Thus, while additional clock speeds are beneficial, the space on die to generate multiple clock signals having different timings is shrinking. Additionally, as devices increase in complexity, differences between clock signals (e.g., jitter amongst one or more clock signals) reduces the operational ability of the device.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, memory devices increasingly utilize clock signals having different frequencies. However, it is additionally important for the clock signals of a memory device to be free from errors, for example, jitter. Jitter in a clock signal can represent deviation of a clock edge from its intended location and can influence the operation of the memory device. Accordingly, when generating clock signals having differing frequencies and if the clock signals generated include jitter, for example, jitter that differs from one clock signal to another, the differences in the clock signals can lead to sub-optimal performance of the memory device.

Present embodiments include circuitry and techniques to reduce output jitter in generated clock signals. In one embodiment, this may be accomplished by using a reduced frequency input clock and internally generating the full frequency clock. For example, the input clock can be provided to the memory device at desired output frequency divided by the burst length. Thereafter, internal cascaded clock adjustment circuits can function to generate the internal clock at a desired frequency. By utilizing multiple cascaded clock double circuits, each generated edge originates from the same initial clock edge so that any jitter is common between all generated clock signals having different frequencies. In this manner, by using a multiplied clock from the same edge effectively removes eye-to-eye jitter from the burst (zero 'intra-burst' jitter). For example, if the desired output double-data rate is 4.8 Gbps (normally a 2.4 GHz clock) and a burst length of 16, this scheme would use a 150 MHz clock, internally multiplied up to 2.4 GHz.

Figure 1:
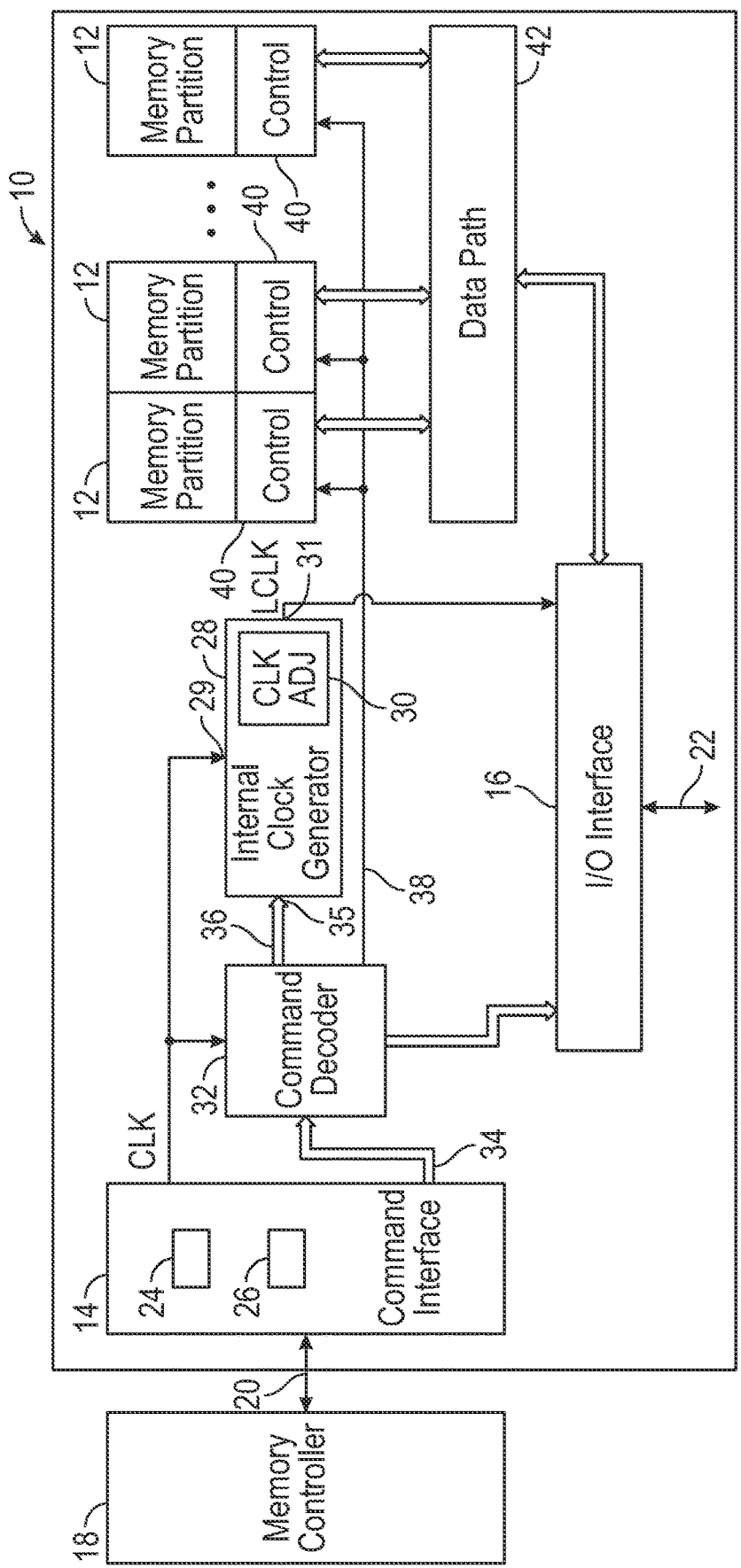
FIG. 1 is a simplified block diagram illustrating certain features of a first embodiment of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a random access memory (RAM) device, a dynamic RAM (DRAM) device, a static RAM (SRAM) device (including a double data rate SRAM device), flash memory, and/or a phase change memory (PCM) device and/or other chalcogenide-based memory, such as self-selecting memories (SSM), a double data rate type five synchronous dynamic random access memory (DDR5 SDRAM) device, or another type device in which an output is generated as having minimum jitter associated therewith. Memory cells of the memory device 10 can each have a corresponding logic storing device (e.g., a capacitor, a resistor, or the resistance of the chalcogenide material(s)).

In some embodiments, when the memory device 10 is a PCM device, it may be a 3D XPoint memory device as a non-volatile memory that utilizes chalcogenide material(s) to allow for state changes of memory cells therein. The changing of one state to another, for example, a crystalline phase (e.g., an orderly phase of the material of the memory cells of the PCM device) having a relative low resistance to an amorphous phase (e.g., a disorderly phase of the material of the memory cells of the PCM device) having relative high resistance may be controlled through the application of, for example, heat to the materials of the PCM. The states themselves, based on their differences in resistivity, represent whether the phase change memory cell stores "1" or "0" as a binary value.

The memory device 10 may include a number of memory partitions 12 each inclusive of one or more arrays (i.e., memory arrays). Various configurations, organizations, and sizes of the memory partitions 12 on the memory device 10 may be utilized depending on the application and design of the overall system. The memory device 10 may also include a command interface 14 and an input/output (I/O) interface 16. The command interface 14 is configured to provide a number of signals from an external device, such as a processor or controller (e.g., memory controller 18) external to the memory device 10. In some embodiments, a bus 20 (or a signal path or another group of signal paths) may, individually or in combination, allow for bidirectional transmission of signals between the command interface 14 and the processor or controller (e.g., the memory controller 18). Likewise, a bus 22 (or a signal path or another group of signal paths) may, individually or in combination, allow for bidirectional transmission of signals, including, for example, data signals, between the I/O interface 16 and, for example, the processor or controller (e.g., the memory controller 18). Thus, the processor or controller, for example, the memory controller 18, may provide various signals to the memory device 10 to facilitate the transmission and receipt of data to be written to or read from the memory device 10.

As will be appreciated, the command interface 14 may include a number of circuits, such as a clock input circuit 24 and a command address input circuit 26, for instance, to ensure proper handling of the received signals. The command interface 14 may receive one or more clock signals from an external device, such as a processor or controller (for example, the memory controller 18 or a register clock driver (RCD) for a dual inline memory module), for example, at the clock input circuit 24. Likewise, the command interface 14 receives commands (e.g., read command, write command, etc.), which may be entered on the positive edges of a clock signal as well as data, which typically is transmitted or received on both positive and negative clock edges. In some embodiments, the commands can be of a variable clock length (e.g., one or more clocks are used to receive the commands).

The clock input circuit 24 receives the one or more clock signals and transmits an internal clock signal CLK therefrom (e.g., based upon the received one or more clock signals). In some embodiments, the internal clock signal CLK is supplied to an internal clock generator 28, such as a delay locked loop circuit (DLL) at input 29 of the internal clock generator 28. The internal clock generator 28 generates a phase controlled internal clock signal (LCLK) based on the received internal clock signal CLK. Additionally, as illustrated, clock adjustment circuitry 30 may be disposed in the internal clock generator 28 and may operate to adjust the internal clock signal CLK to have a different frequency as the phase controlled internal clock signal LCLK. However, it should be appreciated that the clock adjustment circuitry may instead be disposed downstream of the internal clock generator 28 (i.e., coupled to an output 31 of the internal clock generator 28. Likewise, it should be appreciated that the clock adjustment circuitry 30, when internal to the internal clock generator 28, may generate an output signal that is transmitted from the output 31 of the internal clock generator 28.

As will additionally discussed below, clock adjustment circuitry 30 may operate to adjust the internal clock signal CLK to have a different frequency as the phase controlled internal clock signal LCLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to an input 35 of the internal clock generator 28 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory partition 12 corresponding to the command, via bus path 38. As will be appreciated, the memory device 10 may include various other decoders, such as row decoders and column decoders, to facilitate access to the memory partitions 12. In one embodiment, each memory partition 12 includes a control block 40 which provides the necessary decoding (e.g., row decoder and column decoder), as well as other features, such as timing control and data control, to facilitate the execution of commands to and from the memory partitions 12.

The memory device 10 executes operations, such as read commands and write commands, based on the command/address signals received from an external device, such as a processor and/or by the memory controller 18. In one embodiment, command/address signals are clocked to the command interface 14 using clock signals. The command interface 14 may include the command address input circuit 26, which is configured to receive and transmit the commands to provide access to the memory partitions 12, through the command decoder 32, for instance. In addition, the command interface 14 may receive memory select signals that enable the memory device 10 to process commands on the incoming command/address signals. Access to specific memory partitions 12 within the memory device 10 can be encoded in the commands.

In addition, the command interface 14 may be configured to receive a number of other command signals. For instance, a reset command may be used to reset the command interface 14, status registers, state machines and the like, during power-up for instance. Various signals to facilitate testing of the memory device 10 may be provided, as well. For instance, the testing signals may be used to place the memory device 10 into a test mode for connectivity testing. The command interface 14 may also be used to provide an alert signal or another alarm signal to the system processor or controller for certain errors that may be detected. However, in some embodiments, the I/O interface 16 may additionally or alternatively be utilized to transmit an alert signal, for example, a thermal alert.

Data may be sent to and from the memory device 10, utilizing the command and clocking signals discussed above, by transmitting and receiving data signals through the I/O interface 16. More specifically, the data may be sent to or retrieved from the memory partitions 12 over the data path 42, which includes a plurality of bi-directional data buses. Data I/O signals, are generally transmitted and received in one or more bi-directional data busses to and from the I/O interface 16. For certain memory devices, such as a DDR5 SDRAM memory device, the I/O signals may be divided into upper and lower bytes; however, such segmentation is not required for other memory device types.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

The memory device 10 may benefit from having clock signals with varying frequencies. Moreover in accordance with present embodiments, when outputting a data (or a burst sequence of data signals through the I/O interface 16), the data (or burst) will be based on the single clock edge, i.e., the internal clock signal CLK. Each bit of data will reference a rising or a falling edge of that clock so that it's synchronized. Thus, if there is jitter coming in (via the internal or external clock signal, CLK or the clock from the memory controller 18), this will be translated to the output (i.e., the data outputted from the I/O interface 16). However, as will be discussed in greater detail herein, additional external jitter will not be present in the output.

Indeed, in present embodiments, the internal clock signal CLK may be running at a fraction of the desired frequency, for example, one eighth of the desired frequency. This relatively slow rate for the internal clock signal CLK allows for less jitter being present. The internal clock signal CLK may also operate as the initial rising edge from which data outputs are based. For example, if the memory device 10 transmits a set of data bits (e.g., one byte or two bytes) as an output from the memory device 10, the set of data bits are transmitted based off of the single input clock (i.e., the internal clock signal CLK having an initial single clock edge). This occurs for each of rising and falling edge data outputs from the I/O interface 16. In this manner, by utilizing a single clock (e.g., the internal clock signal CLK) as basis from which to generate other clock signals (instead of applying other externally generated clock signals at various frequencies received by the command interface 14), every clock edge used to transmit data from the memory device 10 (e.g., rising and falling edges) originates from the same initial edge of the clock input to the memory device 10 (e.g., the internal clock signal CLK). Thus, the data output will not be exposed to additional externally generated jitter.

One technique to internally provide varied frequency clock signals (i.e., through manipulation of the internal clock signal CLK) is to utilize clock multiplication. Additionally, in one embodiment, jitter reduction of the multiplied clock signals can be performed utilizing a phase locked loop (PLL). However, a PLL typically has long lock acquisition times and potential jitter amplification and/or generation associated therewith (e.g., due to the voltage controlled oscillator of the PLL). Additionally, a PLL solution is tends to be a relatively high-power solution to elimination/reduction of jitter in generated clock signals. For example, if the PLL or clock is turned off, the full lock time for the PLL is required when the PLL is re-enabled since the lock acquisition time can run, for example, into the milliseconds. For this reason, the PLL is usually kept on all the time, which leads to greater power usage. Thus, while one embodiment can include use of a PLL as the clock adjustment circuitry 30, it may be advantageous to utilize other circuitry that may be associated with fewer of the effects described above with respect to utilizing a PLL as the clock adjustment circuitry 30. Accordingly, in other embodiments, clock adjustment circuitry 30 may be implemented having alternative circuitry to a PLL.

Figure 2:
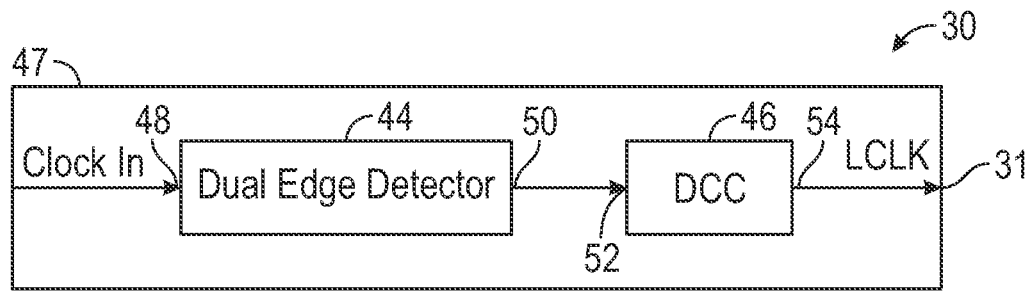
FIG. 2 is a schematic diagram of the clock adjustment circuitry of the memory device of FIG. 1, according to an embodiment of the present disclosure.

FIG. 2 illustrates an example of the clock adjustment circuitry 30. As illustrated, the clock adjustment circuitry includes an edge detector circuit 44 (e.g., a dual edge detector) in conjunction with a duty cycle corrector (DCC) 46, which as illustrated may be collectively referred to as a clock doubler circuit 47. The clock doubler circuit 47 may operate to double the frequency of a received signal (e.g., clock signal) however, in other embodiments, other increases or decreases of a signal generated by the clock doubler circuit 47 relative to the frequency of a received signal by the clock doubler circuit 47 may be performed by the clock doubler circuit 47. For example, the clock doubler circuit 47 may operate to increase the frequency of a received signal by approximately two times, four times, eight times, or another multiplier of the frequency of the received signal.

Moreover, as will be discussed in greater detail below, the clock doubler circuit 47 may be cascaded (i.e., multiple individual clock doubler circuits 47 each inclusive of the edge detector circuit 44 coupled to the DCC 46 as illustrated in FIG. 2 may be connected in series) for example, to increase the overall output frequency of the generated phase controlled internal clock signal LCLK referenced to a single input clock, for example, internal clock signal CLK. Thus, in some embodiments, the clock adjustment circuitry 30 can include cascaded clock doubler circuits 47 in place of the single clock doubler circuit 47 illustrated in FIG. 2. It should be noted that the techniques described below may be undertaken as the memory device 10 is powered-up (e.g., initialized) and/or upon reset of the internal clock generator 28 and can be applied during operation of the memory device 10.

In operation, the dual edge detector circuit 44 receives from input 48 an input signal (e.g., a clock signal) to be adjusted. This adjustment may include adjusting the frequency of the input signal by a predetermined amount (e.g., doubling the frequency of the input signal). Thus, the edge detector circuit 44 generates a resultant signal having a frequency that is a predetermined multiple of the input signal received at input 48 (e.g., a frequency that is two times the frequency of the input signal). The dual edge detector circuit 44 also transmits the resultant signal from output 50. It should be noted that input 48 may be coupled to additional circuitry of the internal clock generator 28. However, in other embodiments, input 48 and input 35 may be a common output (i.e., the edge detector circuit 44 may directly receive the internal clock signal CLK via input 29 as the input signal to the edge detector circuit 44).

However, in some embodiments, the duty cycle of the resultant signal is altered relative to the duty cycle of the input signal received at input 48. Therefore, the resultant signal is transmitted from output 50 of the edge detector circuit 44 to input 52 of the DCC 46. The DCC 46, when in operation, adjusts the duty cycle of the resultant signal received at input 52 to a predetermined value. For example, the DCC 46 may adjust the duty cycle of the resultant signal received at input 52 to generate an adjusted signal having a 50% duty cycle (or another predetermined value). This results in the adjusted signal having a predetermined duty cycle (as generated by the DCC) and a predetermined frequency (as generated by the edge detector circuit 44). The DCC 46 transmits the adjusted signal from output 54 as, for example, phase controlled internal clock signal LCLK. As illustrated output 54 is coupled to output 31. However, in other embodiments, output 54 and output 31 may be a common output (i.e., the DCC 46 may directly output the adjusted signal via output 31).

Figure 3:
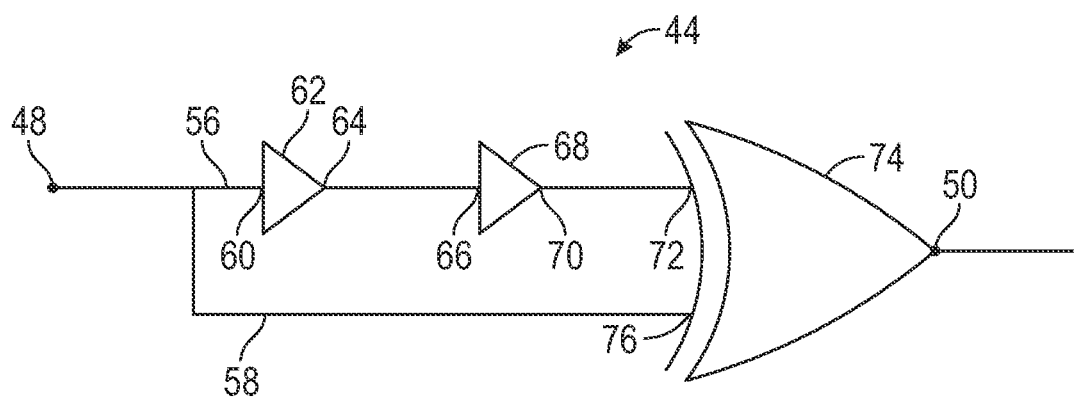
FIG. 3 is a schematic diagram of the edge detector circuit of the clock adjustment circuitry of FIG. 2, according to an embodiment of the present disclosure.

FIG. 3 provides one example of an embodiment of the edge detector circuit 44. It should be noted that FIG. 3 is for illustrative purposes and alternate circuitry could be implemented in the edge detector circuit 44 to adjusting the frequency of a received input signal by a predetermined amount. As illustrated in FIG. 3, the edge detector circuit 44 includes a first path 56 and a second path 58 that are each coupled to input 48. Path 56 is coupled to input 60 of driver 62 (e.g., a buffer circuit or a delay circuit, for example, 2 inverter circuits in series). Driver 62 operates, for example, to increase the drive capability of the signal received at input 60 and transmits the resultant signal from output 64 to input 66 of driver 68 (e.g., a buffer circuit or a delay circuit). Output 70 of driver 68 is coupled to input 72 of XOR gate 74. Additionally, path 58 is coupled to input 76 of XOR gate 74. The delay (e.g., a non-inverted delay) generated via driver 62 and driver 68 may be set to, for example, approximately one quarter of the fastest input period. However, this delay can be varied, for example, when clock doubler circuits 47 are cascaded.

In operation, edge detector circuit 44 operates to double the frequency of the input signal (e.g., a clock input) received from input 48 and transmit the resultant signal from output 50. However, as noted above, this resultant signal transmitted from output 50 does not have the same duty cycle as the input signal received from input 48. Accordingly, the resultant signal generated by the edge detector circuit 44 can be transmitted to the DCC 46, as discussed above.

Figure 4:
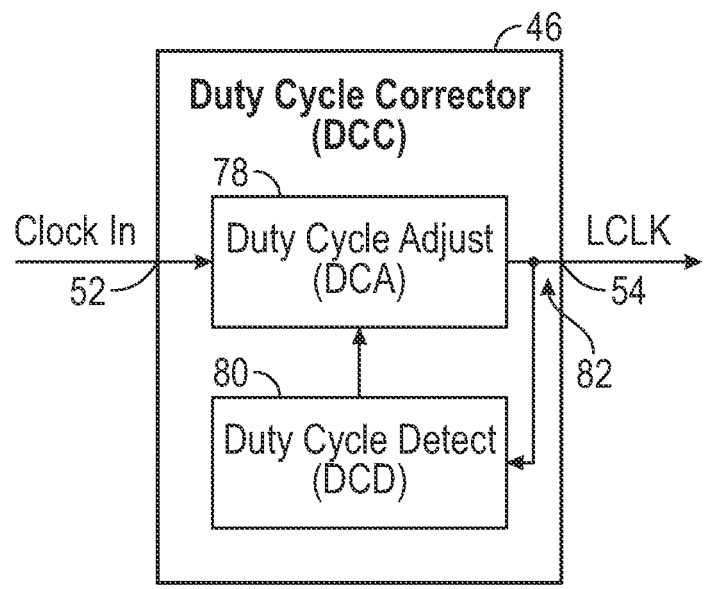
FIG. 4 is a schematic diagram of the duty cycle corrector of the clock adjustment circuitry of FIG. 2, according to an embodiment of the present disclosure.

FIG. 4 illustrates provides one example of an embodiment of the DCC 46. It should be noted that FIG. 4 is for illustrative purposes and alternate circuitry could be implemented in the DCC 46 to adjusting the duty cycle a received input signal by a predetermined amount. In operation, the DCC 46 alters the signal received at input 52 (e.g., a clock input signal) so that the signal transmitted from output 54 has a predetermined (e.g., 50%) duty cycle. In some embodiments, this duty cycle determines the data eye width for the memory device 10. Additionally, it should be noted that while present embodiments utilize the DCC 46 in the clock adjustment circuitry 30, other additional circuitry (either in the internal clock generator 28 and/or in additional locations in the memory device 10) can operate to further tune any static duty cycle errors.

As illustrated in FIG. 4, the DCC 46 includes a duty cycle adjust circuit (DCA) 78 and a duty cycle detect circuit (DCD) 80. In some embodiments, the DCC 46 is a separate closed loop system that is integrated into the internal clock generator 28 (e.g., into the schematics of a DLL). Additionally, in some embodiments utilizing a DLL, the DCA 78 is placed upstream of a DLL delay line to ensure that the duty cycle of the input signal is corrected prior to propagating through the delay line, for example, to reduce the chance for collapse of the signal at certain high frequencies of the input signal. The DCD 80 can be placed with additional DLL control blocks.

In some embodiments, the DCA 78 is a digital DCA 78 while DCD 80 is an analog DCD 80. The DCA 78 can include variable strength inverters with a phase mixer to provide high resolution steps (e.g., approximately 1 ps). The DCD 80 when in operation integrates the voltage of the received signal (e.g., the clock voltage) to determine whether the clock needs to be widened or narrowed to meet the predetermined duty cycle value. Additionally illustrated is a sense point 82, which operates as a feedback (with various sense-point options) from the DCA 78 to the DCD 80. Based on the feedback received from the sense point 82, the DCD 80 can generate and transmit an adjustment signal to the DCA 78 that is used by the DCA 78 to adjust the duty cycle of the signal generated by the DCA 78, which is transmitted to output 54.

The clock adjustment circuitry 30, as previously discussed in conjunction with FIG. 2 and utilizing, for example, the edge detector circuit 44 of FIG. 3 and the DCC 46 of FIG. 4, may have advantages with respect to the use of a PLL as the clock adjustment circuitry 30. For example, the DCC 46 can be initialized and then the DCD 80 can be disabled subsequent to a lock occurring. This can operate to reduce power consumed by the clock adjustment circuitry 30, especially relative to use of a PLL in the clock adjustment circuitry 30. Additionally, the locked DCC 46 does not lose the correction information if the clock is removed (i.e., the control of the DCC 46 may be digital, such that when the incoming clock is disabled, the correction information is preserved), which further reduces the power consumed. Additionally, in some embodiments, as will be discussed in further detail below, the series connection of the edge detector circuit 44 and the DCC 46 (collectively which may be referred to as a clock doubler circuit 47) can be repeated to increase the frequency of the generated phase controlled internal clock signal LCLK to have the correct frequency, for example, to be utilized in a burst operation of the memory device 10.

Figure 5:
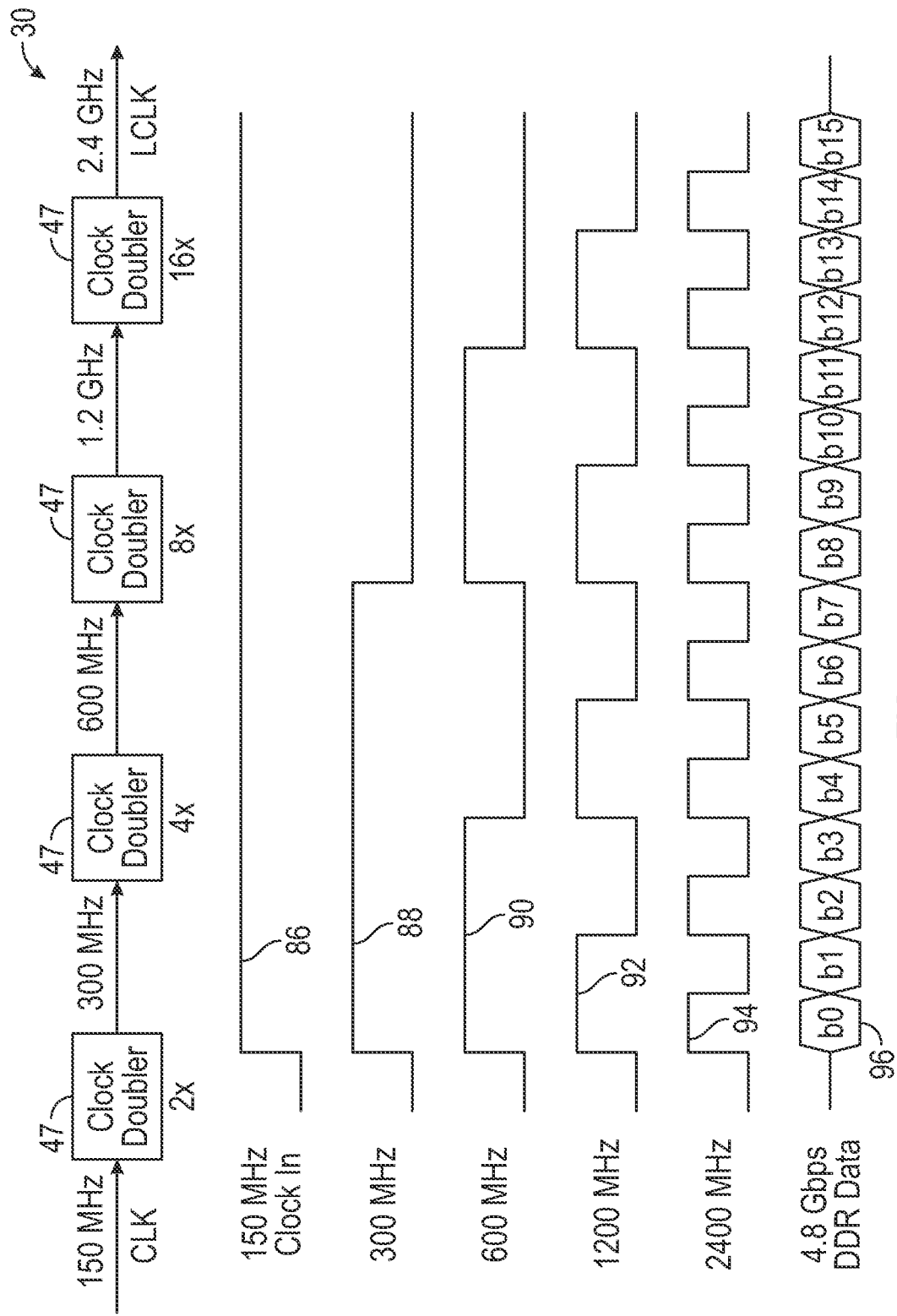
FIG. 5 is an embodiment of the clock adjustment circuitry of the memory device of FIG. 1 and a first timing diagram illustrating generation of clock signals for the memory device of FIG. 1, in accordance with an embodiment.

FIG. 5 illustrates an example of the clock adjustment circuitry 30 inclusive of cascaded clock doubler circuits 47. While four clock doubler circuits 47 are illustrated, it should be noted that "n" doubler circuits 47 (whereby "n" is a positive integer number) may be employed to generate an output clock (e.g., phase controlled internal clock signal LCLK) having a predetermined frequency. In this manner, "n" may be selected to generate a predetermined number of clock edges in a given period of time (i.e., the clock frequency) to correspond to a data transfer having a desired speed. In some embodiments, each clock doubler circuit 47 can be arranged as the edge detector circuit 44 and the DCC 46 in FIG. 2. In this manner, the clock adjustment circuitry 30 of FIG. 5 includes cascaded clock doubler circuits 47. Moreover, in some embodiments, an "n" number of edge detector circuits 44 may be coupled in series with a DCC 46 coupled in series thereafter in place of "n" doubler circuits 47. Likewise, in some embodiments, an "n" number of edge detector circuits 44 may be coupled in series with an "m" total number of DCC 46, where respective DCC 46 are directly coupled in series behind some of the edge detector circuits 44 of the "n" number of edge detector circuits 44, and whereby "m" is a positive integer number having a value less than "n".

As previously noted, four clock doubler circuits 47 are illustrated (so as to correspond to a 16 bit burst data transfer). Thus, for a received signal (e.g., internal clock signal CLK) having a frequency of, for example, 150 MHz (illustrated by clock 86), the first clock doubler circuit 47 doubles the clock frequency of the signal it receives to 300 MHz (illustrated by clock 88), the second clock doubler circuit 47 doubles the clock frequency of the signal it receives to 600 MHz (illustrated by clock 90), the third clock doubler circuit 47 doubles the clock frequency of the signal it receives to 1.2 GHz (illustrated by clock 92), and the fourth clock doubler circuit 47 doubles the clock frequency of the signal it receives to 2.4 GHz (illustrated by clock 94). Thus, the output clock from the clock adjustment circuitry 30 corresponds to, for example, a phase controlled internal clock signal LCLK of 2.4 GHz, which may be applied to data transfers (illustrated by data transfer 96) of 4.8 Gbps (when the data is transmitted on rising and falling edges, such as in DDR memory as chosen type for memory device 10). In this manner, FIG. 5 illustrates that by cascading clock doubler circuits 47, a clock signal can be multiplied in the memory device 10 utilizing edge detector circuit 44 and DCC 46 as components. However, FIG. 5 presents an example, where the clock input signal (e.g., the internal clock signal CLK) is illustrated as having no jitter.

Figure 6:
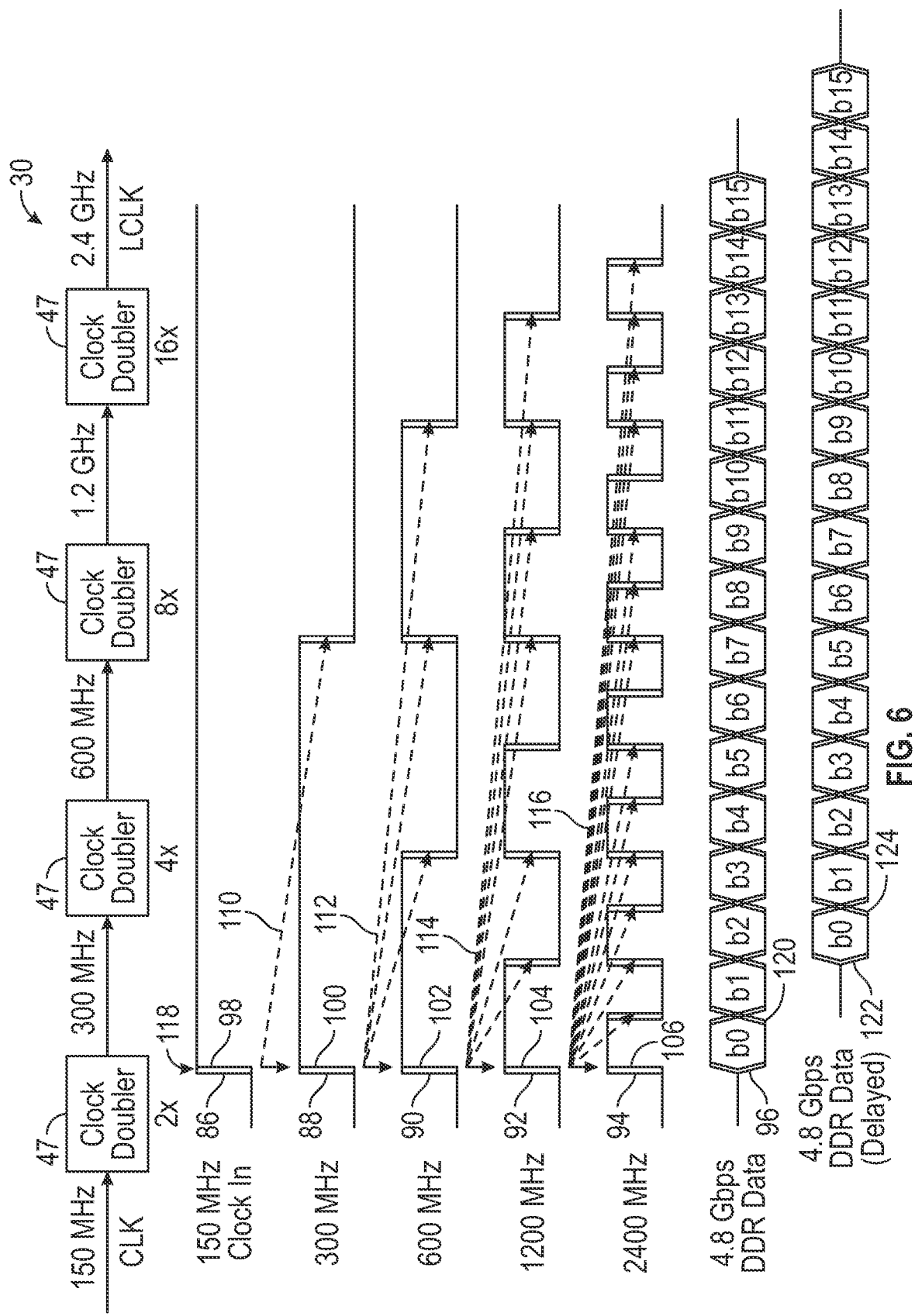
FIG. 6 is a second timing diagram illustrating generation of second clock signals by an embodiment of the clock adjustment circuitry of the memory device of FIG. 1, in accordance with an embodiment.

FIG. 6 illustrates an example of the clock adjustment circuitry 30 inclusive of clock doubler circuits 47 wherein the input signal (e.g., the internal clock signal CLK) includes jitter. While four clock doubler circuits 47 are illustrated, it should be noted that "n" doubler circuits 47 (whereby "n" is a positive integer number) may be employed to generate an output clock (e.g., phase controlled internal clock signal LCLK) having a predetermined frequency. In this manner, "n" may be selected to generate a predetermined number of clock edges in a given period of time (i.e., the clock frequency) to correspond to a data transfer having a desired speed. In some embodiments, each clock doubler circuit 47 can be arranged as the edge detector circuit 44 and the DCC 46 in FIG. 2. In this manner, the clock adjustment circuitry 30 of FIG. 5 includes cascaded clock doubler circuits 47. Moreover, in some embodiments, an "n" number of edge detector circuits 44 may be coupled in series with a DCC 46 coupled in series thereafter in place of "n" doubler circuits 47. Likewise, in some embodiments, an "n" number of edge detector circuits 44 may be coupled in series with an "m" total number of DCC 46, where respective DCC 46 are directly coupled in series behind some of the edge detector circuits 44 of the "n" number of edge detector circuits 44, and whereby "m" is a positive integer number having a value less than "n".

As previously noted, four clock doubler circuits 47 are illustrated (so as to correspond to a 16 bit burst data transfer). For illustrative purposes, clock 86, clock 88, clock 90, clock 92, clock 94, and data transfer 96 of FIG. 5 have been illustrated in FIG. 6. Additionally, as noted above, the received signal (e.g., internal clock signal CLK) in FIG. 6 includes jitter. Therefore, the input signal (e.g., internal clock signal CLK) of FIG. 6 is illustrated as having a frequency of, for example, 150 MHz (as clock 98) that is misaligned with clock 86 due to the jitter of the input signal (e.g., internal clock signal CLK). Similarly, the first clock doubler circuit 47 doubles the clock frequency of the signal it receives to 300 MHz (illustrated by clock 100) inclusive of the jitter from the input signal (e.g., internal clock signal CLK), the second clock doubler circuit 47 doubles the clock frequency of the signal it receives to 600 MHz (illustrated by clock 102) inclusive of the jitter from the input signal (e.g., internal clock signal CLK), the third clock doubler circuit 47 doubles the clock frequency of the signal it receives to 1.2 GHz (illustrated by clock 104) inclusive of the jitter from the input signal (e.g., internal clock signal CLK), and the fourth clock doubler circuit 47 doubles the clock frequency of the signal it receives to 2.4 GHz (illustrated by clock 106) inclusive of the jitter from the input signal (e.g., internal clock signal CLK).

In this manner, as can be seen at each of clock edges 110, clock edges 112, clock edges 114, and clock edges 116, the jitter from the input signal (e.g., internal clock signal CLK) is transferred equally to all of the multiplied clock edges (i.e., clock edges 110, clock edges 112, clock edges 114, and clock edges 116). That is, each of clock edges 110, clock edges 112, clock edges 114, and clock edges 116 are generated utilizing the clock adjustment circuitry 30 inclusive of clock doubler circuits 47 from edge 118 of the input signal (e.g., internal clock signal CLK).

This results in effectively zero intra-burst jitter in the data output, as can be understood by data transfer 120. That is, the output clock from the clock adjustment circuitry 30 corresponds to, for example, a phase controlled internal clock signal LCLK of 2.4 GHz with a jitter that is carried through equally through each frequency adjustment so that when it is applied to data transfers (illustrated by data transfer 120) of 4.8 Gbps (when the data is transmitted on rising and falling edges, such as in DDR memory as chosen type for memory device 10), the data transfer 120 is merely offset as a whole with respect to data transfer 96 but the individual bits transferred are not subject to intra-burst jitter with respect to one another. Moreover, if each data transfer 120 is separated, for example, by one clock pulse of clock 106, there is effectively zero intra-burst jitter in the data output. Since all of the bits in the 16 bit burst are shifted by the same amount so that the edge to edge relationship (e.g., the width of each bit) remains constant (i.e., no data eye of the bits in the data transfer 120 is affected by jitter in the received signal (e.g., internal clock signal CLK). This can allow for increased data transfer speeds in the memory device 10.

Additionally data strobe (DQS) signals are generated from the same edge, edge 118 (i.e. a single clock edge). DQS signals typically are used in double data rate synchronous dynamic random access memory (DDR SDRAM) of various types (e.g., DDR3 SDRAM, DDR4 SDRAM, DDR5 SDRAM, etc.). Similar strobe signals are utilized in, for example, low power dynamic random access memory (LPDRAM). The DQS signals are driven by the external processor or memory controller 18 sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. Therefore, there is no additional intra-burst jitter for generated DQS signals.

Typically, DQS signals are generated by the same clock edge that is used to transmit output data (e.g., data bits in a data burst) in conjunction with a read operation by the memory device 10. However, in some memory devices 10 (e.g., DDR5 SDRAM), the DQS signal can be generated earlier or later than the clock that is used to output data signals (e.g., DQ signals). For example, the clock difference may be by "n" clocks, whereby "n" is a positive integer value. The "n" clock difference between the DQS clock and the DQ clock reduces the source-synchronous nature of data clocking. That is, the strobe (e.g., DQS signal) may have a different jitter than the corresponding bit (e.g., of the DQ signal). However, utilizing the circuitry and techniques described above, in one embodiment, DQ signals can be delayed internal to the memory device 10 to ensure that the same multiplied edge is used to generate the DQS signal and the DQ signals. This allows the "n" clock shifted DQS to have the same jitter as the output data with the same jitter reduction, resulting in a source-synchronous strobing of the data read from the memory device 10.

For example, in conjunction with FIG. 6, clock 106 is inclusive of the jitter from the input signal (e.g., internal clock signal CLK). In some embodiments, clock 106 can be routed as a DQS clock so that the generated DQS signal can be generated from the same multiplied edge (e.g., edge 118) used to generate a clock used in transmission of the DQS signals. The same clock 106 could be additionally routed and delayed, for example, as delayed DQ signals internal to the memory device 10. This delay of the DQ signals can be represented in FIG. 6, whereby data transfer 122 is based from the clock input signal (e.g., the internal clock signal CLK) is illustrated as having no jitter and the data transfer 124 is generated based on the edge 118 of the input signal (e.g., internal clock signal CLK) (in common with the clock 106 as the DQS clock). Thus, despite the DQ signals being delayed (as illustrated via data transfer 124 relative to data transfer 120) to meet the output requirements of the memory device 10, the source-synchronous nature of the DQS/DQ strobing is restored, since both signals are generated based on the same multiplied edge (e.g., edge 118). This results in effectively zero intra-burst jitter in the data output.

Figure 7:
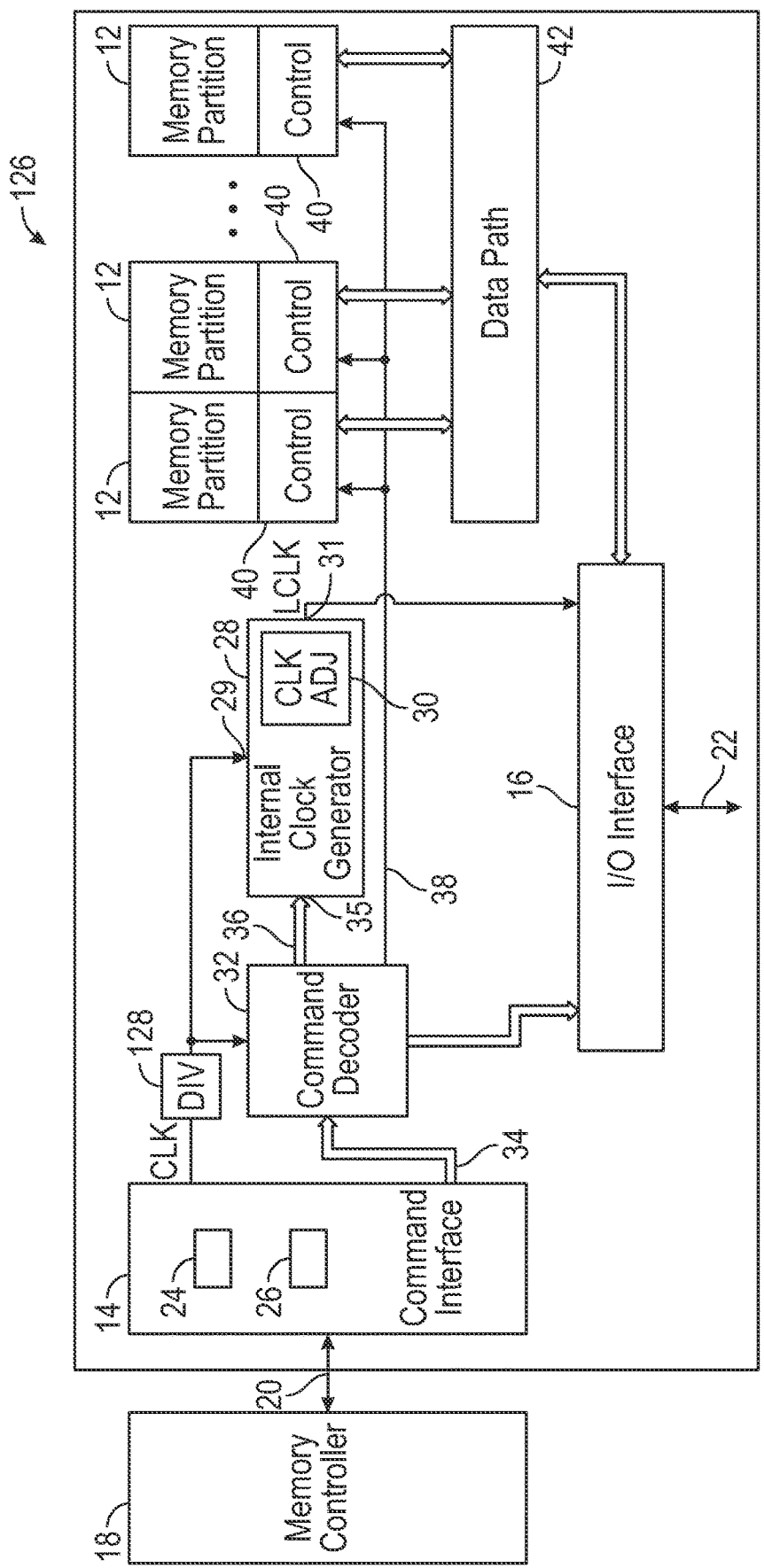
FIG. 7 is a simplified block diagram illustrating certain features of a second embodiment of a memory device, according to an embodiment of the present disclosure.

In some embodiments of the memory device 10 (e.g., DDR4 SDRAM, DDR5 SDRAM, etc.), a divided clock signal is not received from, for example, the memory controller 18 and the clock input circuit 24 does not generate a divided clock signal. FIG. 7 illustrates a simplified block diagram illustrating certain features of a memory device 126 that does operate to generate a divided clock as an example of a memory device 126 that is not provided a divided clock. By use of the clock adjustment circuitry 30 in the manner described above with respect to FIGS. 1-4, jitter reduction can still be achieved by dividing the clock to the desired frequency in the memory device 126 using, for example, clock divider circuit 128 that operates to reduce the frequency of the clock it receives and generate the reduced frequency clock. Thereafter, use of a series of clock doublers 47 to regenerate the clock frequency as part of clock adjustment circuitry 30 can generate the divided and multiplied clock signals each having the same jitter reduction.

In other embodiments, the clock input circuit 24 of the memory device 126 receives the one or more clock signals and generates an internal clock signal (e.g., CLK) therefrom. However, the memory device 126 (e.g., a DDR4 SDRAM or a DDR5 SDRAM) may be placed into a gear down mode in which the internal clock signal is generated at a first frequency, however, the commands are transmitted, for example, to the command interface 14 at a reduced rate (i.e., at a second frequency that is slower than the first frequency that corresponds to the internal clock signal). This may operate to, for example, to reduce power expended from the memory controller 18 to the memory device 10. Through utilization of the clock adjustment circuitry 30 in the manner described above with respect to FIGS. 1-4 in conjunction with the divider circuit 128, jitter reduction can still be achieved by using the divider circuit 128 to divide the internal clock signal (e.g., to save on-chip power expended) and then re-generate (using the clock adjustment circuitry 30) a jitter-reduced clock (e.g., LCLK) to clock the output data (e.g., DQ signals). For example, when the memory device 126 operates with burst lengths of 8 or 16 bits as DQ signals, the system clock (e.g. the internal clock signal CLK) could be divided by 8 or 16 for use with incoming commands and then be re-generated using the clock adjustment circuitry 30 (e.g., a series of clock doublers 47) to generate a jitter-reduced clock to transmit the burst DQ signals.

Figure 8:
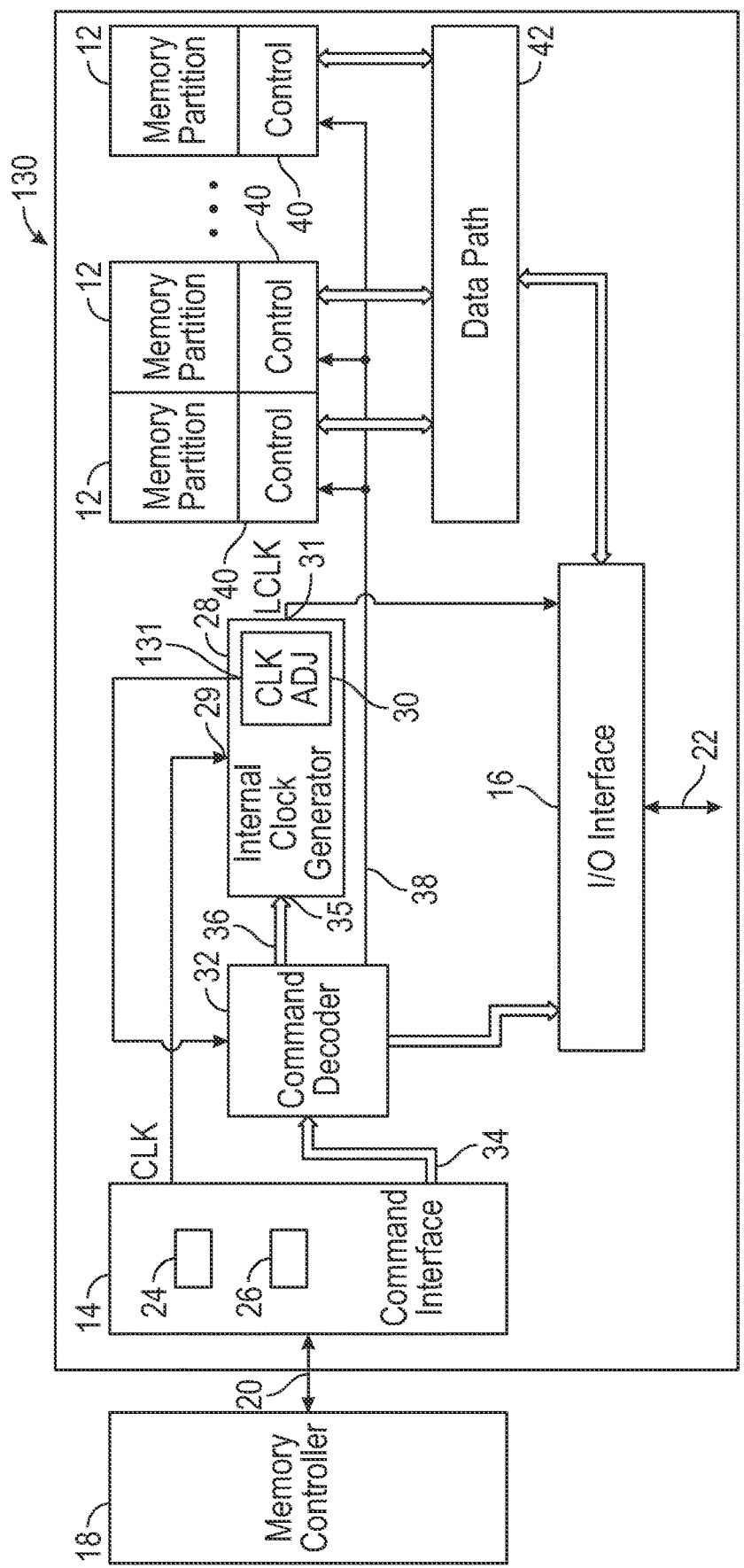
FIG. 8 is a simplified block diagram illustrating certain features of a third embodiment of a memory device, according to an embodiment of the present disclosure.

An alternate technique and circuitry for generating clock signals with multiple frequencies all generated based on the same multiplied edge (e.g., edge 118) is described below. As illustrated, FIG. 8 includes a memory device 130 with clock adjustment circuitry 30 that additionally includes output 131. As illustrated, the output 131 is coupled to a path that connects to the command decoder 32. Additionally, although not illustrated, the output 131 can be coupled to additional circuitry in the memory device 130. In operation, the output 131 can transmit one (or more) clock signals that are generated by the clock adjustment circuitry 30 at a reduced rate relative to LCLK transmitted from output 31. One system to generate additional clock signals at a reduced rate relative to LCLK but larger than the clock input to the memory device 130 (e.g., the internal clock signal CLK) is described in conjunction with FIG. 9.

Figure 9:
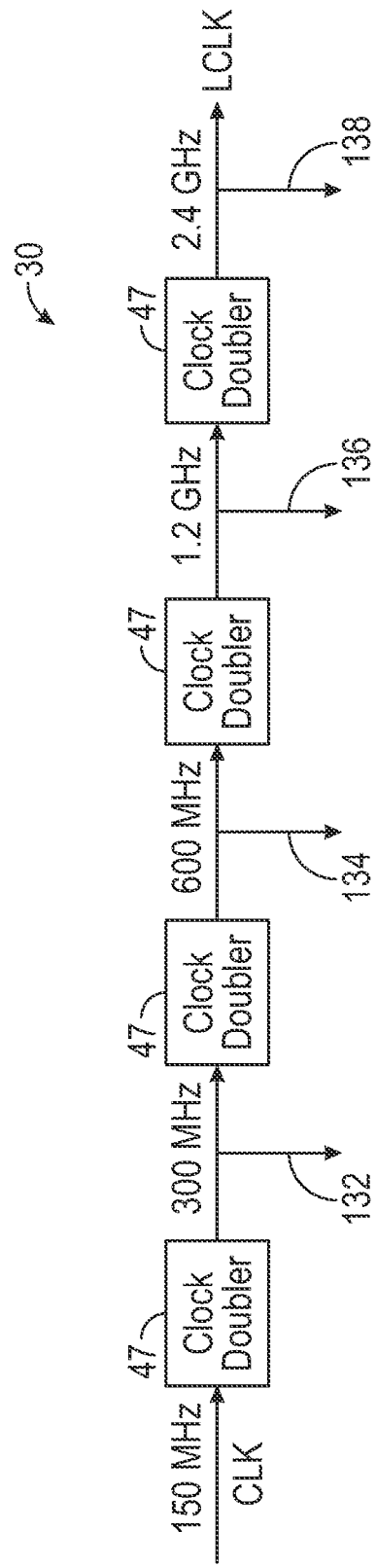
FIG. 9 is an embodiment of the clock adjustment circuitry of the memory device of FIG. 8, in accordance with an embodiment.

FIG. 9 illustrates an embodiment of the clock adjustment circuitry 30 inclusive of cascaded clock doubler circuits 47. While four clock doubler circuits 47 are illustrated, it should be noted that "n" doubler circuits 47 (whereby "n" is a positive integer number) may be employed to generate an output clock (e.g., phase controlled internal clock signal LCLK) having a predetermined frequency. In this manner, "n" may be selected to generate a predetermined number of clock edges in a given period of time (i.e., the clock frequency) to correspond to a data transfer having a desired speed. In some embodiments, each clock doubler circuit 47 can be arranged as the edge detector circuit 44 and the DCC 46 in FIG. 2. In this manner, the clock adjustment circuitry 30 of FIG. 9 includes cascaded clock doubler circuits 47. Moreover, in some embodiments, an "n" number of edge detector circuits 44 may be coupled in series with a DCC 46 coupled in series thereafter in place of "n" doubler circuits 47. Likewise, in some embodiments, an "n" number of edge detector circuits 44 may be coupled in series with an "m" total number of DCC 46, where respective DCC 46 are directly coupled in series behind some of the edge detector circuits 44 of the "n" number of edge detector circuits 44, and whereby "m" is a positive integer number having a value less than "n".

As previously noted, four clock doubler circuits 47 are illustrated (so as to correspond to a 16 bit burst data transfer). Thus, for a received signal (e.g., internal clock signal CLK) having a frequency of, for example, 150 MHz (illustrated by clock 86), the first clock doubler circuit 47 doubles the clock frequency of the signal it receives to 300 MHz (illustrated by clock 88). This doubled signal may be transmitted along path 132 to output 131 as a first tapped signal. Additionally, the doubled signal from the first clock doubler circuit 47 may be transmitted to the second clock doubler circuit 47, which doubles the clock frequency of the signal it receives to 600 MHz (illustrated by clock 90). This doubled signal may be transmitted along path 134 to output 131 as a second tapped signal. Additionally, the doubled signal from the second clock doubler circuit 47 may be transmitted to the third clock doubler circuit 47, which doubles the clock frequency of the signal it receives to 1.2 GHz (illustrated by clock 92). This doubled signal may be transmitted along path 136 to output 131 as a third tapped signal. Additionally, the doubled signal from the third clock doubler circuit 47 may be transmitted to the fourth clock doubler circuit 47, which doubles the clock frequency of the signal it receives to 2.4 GHz (illustrated by clock 94).

It should be noted that the output 131 may be coupled to a bus able to route each of the signals received from path 132, path 134, and path 136 to the correct location in the memory device 130. Alternatively, one or more switching elements or a multiplexor circuit may be present in the clock adjustment circuitry 30 and may operate to select one or more of the signals received from path 132, path 134, and path 136 for transmission at output 131. In other embodiments, one or more of path 132, path 134, or path 136 can be omitted (depending on the clock signals utilized in the memory device 130).

Thus, the output clock from the clock adjustment circuitry 30 at output 31 corresponds to, for example, a phase controlled internal clock signal LCLK of 2.4 GHz, which may be applied to data transfers (illustrated by data transfer 96) of 4.8 Gbps (when the data is transmitted on rising and falling edges, such as in DDR memory as chosen type for memory device 10). Likewise, the one or more signals transmitted from the clock adjustment circuitry 30 at output 131 each are generated from the same clock input signal (e.g., the internal clock signal CLK) so that the signals along each of path 132, path 134, and path 136 results in effectively zero intra-burst jitter with respect to one another (as well as with respect to the phase controlled internal clock signal LCLK).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
    a clock input circuit that when in operation receives a clock signal and transmits an internal clock signal based on the clock signal; and
    an internal clock generator coupled to the clock input circuit to receive the internal clock signal, wherein the internal clock generator comprises clock adjustment circuitry that when in operation generates a phase controlled internal clock signal having subsequent clock edges based upon a single clock edge of the internal clock signal, wherein the phase controlled internal clock signal comprises a first frequency as a multiple of a second frequency of the internal clock signal, wherein the clock adjustment circuitry comprises:
        an edge detector circuit that generates an output clock signal having a third frequency as a multiple of the second frequency with a first duty cycle that differs from a second duty cycle of the internal clock signal; and
        a duty cycle corrector comprising a duty cycle adjustment circuit that when in operation adjusts the first duty cycle of output clock signal.

2. The device of claim 1, wherein edge detector circuit comprises a first input that when in operation receives the internal clock signal and a first output that when in operation transmits the output clock signal having the third frequency as a multiple of the second frequency.

3. The device of claim 2, wherein the edge detector circuit comprises:
    at least one delay circuit coupled to the first input; and
    an XOR circuit, comprising:
        a second input coupled to the first input; and
        a third input coupled to a second output of the at least one delay circuit.

4. The device of claim 3, wherein the XOR circuit when in operation generates the output clock signal having the third frequency as equivalent to the first frequency.

5. The device of claim 2, wherein the duty cycle corrector is coupled to the edge detector circuit, wherein the duty cycle corrector comprises a second input that when in operation receives the output clock signal.

6. The device of claim 1, wherein the duty cycle corrector comprises a duty cycle detection circuit coupled to the duty cycle adjustment circuit, wherein when in operation the duty cycle adjustment circuit adjusts the duty cycle of the output clock signal based upon an adjustment signal transmitted from the duty cycle detection circuit to the duty cycle adjustment circuit.

7. The device of claim 1, wherein the duty cycle corrector when in operation adjusts the duty cycle of the output clock signal to a predetermined duty cycle.

8. The device of claim 7, wherein the duty cycle corrector comprises a second output, wherein the duty cycle corrector when in operation transmits the phase controlled internal clock signal as having the predetermined duty cycle.

9. A device, comprising:
    a first clock doubler circuit that when in operation receives an input clock signal having a first frequency, wherein the first clock doubler circuit comprises:

a first edge detector circuit comprising a first input that when in operation receives the input clock signal and a first output that when in operation transmits an output clock signal having a second frequency as a multiple of the first frequency with a first duty cycle that differs from a second duty cycle of the input clock signal; and
a first duty cycle corrector coupled to the first edge detector circuit, wherein the first duty cycle corrector comprises a second input that when in operation receives the output clock signal and a second output that when in operation transmits a first duty cycle adjusted output clock signal having the second duty cycle of the input clock signal.

10. The device of claim 9, comprising:
a second clock doubler circuit coupled to the first clock doubler circuit, wherein the second clock doubler circuit when in operation receives the first duty cycle adjusted output clock signal having the second frequency and the second duty cycle of the input clock signal, wherein the second clock doubler circuit comprises:
a second edge detector circuit comprising a third input that when in operation receives the first duty cycle adjusted output clock signal and a third output that when in operation transmits a second output clock signal having a third frequency as a multiple of the first frequency and the second frequency with a third duty cycle that differs from the second duty cycle of the input clock signal; and
a second duty cycle corrector coupled to the second edge detector circuit, wherein the second duty cycle corrector comprises a fourth input that when in operation receives the second output clock signal and a fourth output that when in operation transmits a second duty cycle adjusted output clock signal having the second duty cycle of the input clock signal.

11. The device of claim 10, wherein the first edge detector circuit comprises:
at least one delay circuit coupled to the first input; and
an XOR circuit, comprising:
a fifth input coupled to the first input; and
a sixth input coupled to a fifth output of the at least one delay circuit.

12. The device of claim 11, wherein the first duty cycle corrector comprises:
a duty cycle adjustment circuit that when in operation adjusts the first duty cycle of the output clock signal; and
a duty cycle detection circuit coupled to the duty cycle adjustment circuit, wherein when in operation the duty cycle adjustment circuit adjusts the first duty cycle of the output clock signal based upon an adjustment signal transmitted from the duty cycle detection circuit to the duty cycle adjustment circuit to the second duty cycle of the input clock signal.

13. The device of claim 12, comprising:
a third clock doubler circuit coupled to the second clock doubler circuit, wherein the third clock doubler circuit when in operation receives the second duty cycle adjusted output clock signal having the third frequency and generates a third duty cycle adjusted output clock signal having a fourth frequency; and
a fourth clock doubler circuit coupled to the third clock doubler circuit, wherein the fourth clock doubler circuit when in operation receives the third duty cycle adjusted output clock signal having the fourth frequency and generates a fourth duty cycle adjusted output clock signal having a fifth frequency.

14. The device of claim 13, comprising an input output interface coupled to the fourth clock doubler circuit, wherein the fourth clock doubler circuit comprises a sixth output that when in operation transmits the fourth duty cycle adjusted output clock signal to the input output interface.

15. The device of claim 14, wherein the input output interface utilizes the fourth duty cycle adjusted output clock signal in a data read operation of the device.

16. The device of claim 15, wherein the first clock doubler circuit comprises a seventh output, wherein the seventh output when in operation transmits the first duty cycle adjusted output clock signal to a command decoder of the device.

17. A system, comprising:
a clock divider circuit that when in operation receives a clock signal having a first frequency, generates an internal clock signal having a second frequency based on the clock signal, and transmits the internal clock signal to a command decoder of the system; and
an internal clock generator coupled to the clock divider circuit to receive the internal clock signal, wherein the internal clock generator comprises clock adjustment circuitry that when in operation generates a phase controlled internal clock signal comprising clock edges based upon a single clock edge of the internal clock signal, wherein the phase controlled internal clock signal comprises a third frequency as a multiple of the first frequency and the second frequency, wherein the clock adjustment circuitry comprises:
an edge detector circuit that generates an output clock signal having the third frequency with a first duty cycle that differs from a second duty cycle of the internal clock signal; and
a duty cycle corrector comprising a duty cycle adjustment circuit that when in operation adjusts the first duty cycle of the internal clock signal.

18. The system of claim 17, comprising an input output interface coupled to the clock adjustment circuitry, wherein the clock adjustment circuitry when in operation transmits the phase controlled internal clock signal to the input output interface.

19. The system of claim 18, wherein the input output interface utilizes the phase controlled internal clock signal in a data read operation of the system.

* * * * *